(12) United States Patent
Anderson et al.

(10) Patent No.: US 7,019,536 B1
(45) Date of Patent: Mar. 28, 2006

(54) MULTIPORT CALIBRATION SIMPLIFICATION USING THE "UNKNOWN THRU" METHOD

(75) Inventors: Keith F. Anderson, Santa Rosa, CA (US); David V. Blackham, Santa Rosa, CA (US); Brad R. Hokkanen, Windsor, CA (US); Kenneth H. Wong, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/028,032

(22) Filed: Jan. 3, 2005

(51) Int. Cl.
*G01R 35/00* (2006.01)

(52) U.S. Cl. .................... 324/601; 324/76.22

(58) Field of Classification Search ........... 324/601, 324/638, 76.22
See application file for complete search history.

(56) References Cited

U.S. PATENT DOCUMENTS 5,748,000 A * 5/1998 Blackham .................. 324/601
6,417,674 B1 * 7/2002 Rowell et al. ............. 324/601
6,836,743 B1 * 12/2004 Blackham et al. ......... 702/107

* cited by examiner

*Primary Examiner*—Walter Benson

(57) ABSTRACT

In one embodiment, a method of calibrating a multi-port vector network analyzer (VNA) includes (i) performing two-port calibrations on pairs of ports to determine forward and reverse systematic error terms associated with each pair of ports, wherein the pairs of ports are selected such that each port's systematic error terms (directivity, source match, reflection tracking, and load match) are determined, (ii) generating a switch error correction matrix using data from the two-port calibrations, and (iii) performing unknown thru calibration for at least one pair of ports that was not utilized in step (i), wherein the unknown thru calibration comprises applying the switch error correction matrix to measurement data and determining transmission tracking error terms using the corrected measurement data.

20 Claims, 5 Drawing Sheets

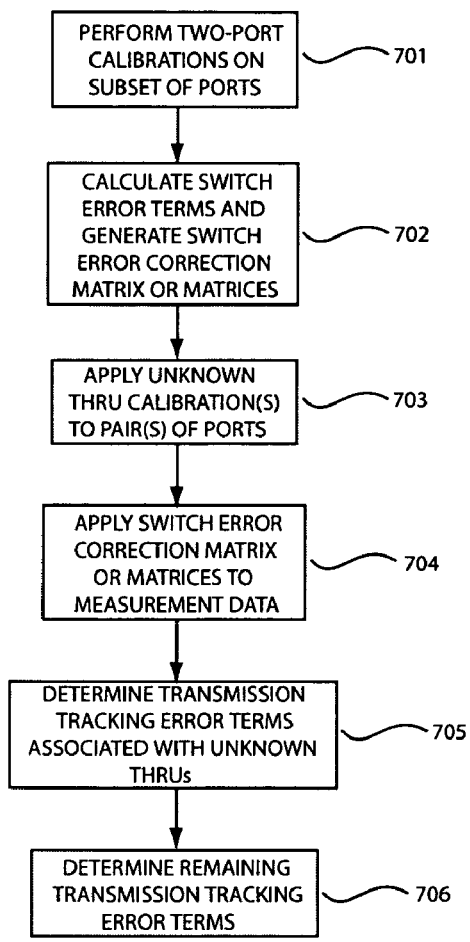
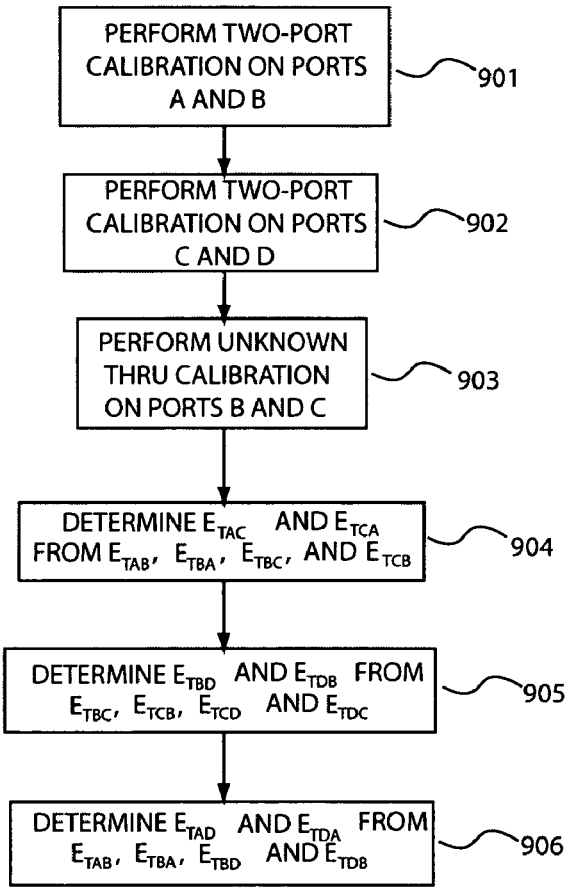

MULTIPORT CALIBRATION SIMPLIFICATION USING THE "UNKNOWN THRU" METHOD

TECHNICAL FIELD

The present application is generally related to calibration of a vector network analyzer (VNA).

BACKGROUND

FIG. 1 depicts VNA 100 according to a conventional design. As shown in FIG. 1, VNA 100 comprises switch 101 to switch between VNA ports A through D to establish a path to a single reference receiver 102. When the RF signal path switch 101 changes position, the termination of the test port also changes. The change in termination causes the source match term to be different from the load match term. The difference is referred to as the "switch error." The standard twelve term VNA error model derives the load match term from the through connection. Additionally, N port VNA calibration methods require a minimum of N−1 paths to be characterized. For a four-port VNA, three through paths are characterized through calibration procedures. However, most N-port devices use connector combinations that do not allow the use of a flush through connection required in typical short, open, load, through (SOLT) calibration method, Accordingly, adapter removal calibration methods are usually employed. This requires another extra calibration step.

The "unknown thru" calibration is ideally suitable to calibrate VNAs to test devices with non mate-able connector combinations. Like the TRL family of calibrations, it is based on the eight term error model and requires two receivers for each test port to obtain the necessary data to determine the VNA's systematic error terms. Accordingly, the usual implementation of the unknown thru calibration method cannot be applied to VNA 100. For VNA's that only possess a single reference receiver, calibration can be unduly time consuming.

SUMMARY

Some representative embodiments are directed to a method of calibration of a VNA having a minimum of one reference receiver. When the VNA possesses an even number of ports ("N" ports), two-port calibration is applied to N/2 pairs of ports using ECal modules or other suitable configurable standards. When the VNA possesses an odd number of ports, the number of port pairs is [(N+1)/2]. The selection of the pair of ports occurs such that the directivity, source match, reflection tracking, and load match of each port, plus forward transmission tracking and reverse transmission tracking of each port pair are determined. After application of the two port calibrations, the unknown thru calibration method is applied to a minimum of (N/2−1) pairs of ports for even number of ports and a minimum of [(N−1)/2−1] for odd number of ports. For the unknown thru calibration, the pairs of ports are selected such that the pairs are different from the pairs used during the two port calibration. From the previously calculated load match terms, switch error terms can be calculated and applied to the measurement data generated by the unknown thru calibration. The transmission tracking error terms associated with the unknown through path(s) are then determined. The remaining (N(N−1)/2) transmission tracking error terms are calculated. Calibration of the multi-port VNA in this manner may occur in substantially less time than known calibration methods.

BRIEF DESCRIPTION OF THE DRAWINGS

FIG. 7 depicts a flowchart for calibration of a multi-port VNA according to one representative embodiment.

FIG. 9 depicts a flowchart for calibration procedures using the set-up shown in FIG. 8 according to one representative embodiment.

DETAILED DESCRIPTION

Figure 1:
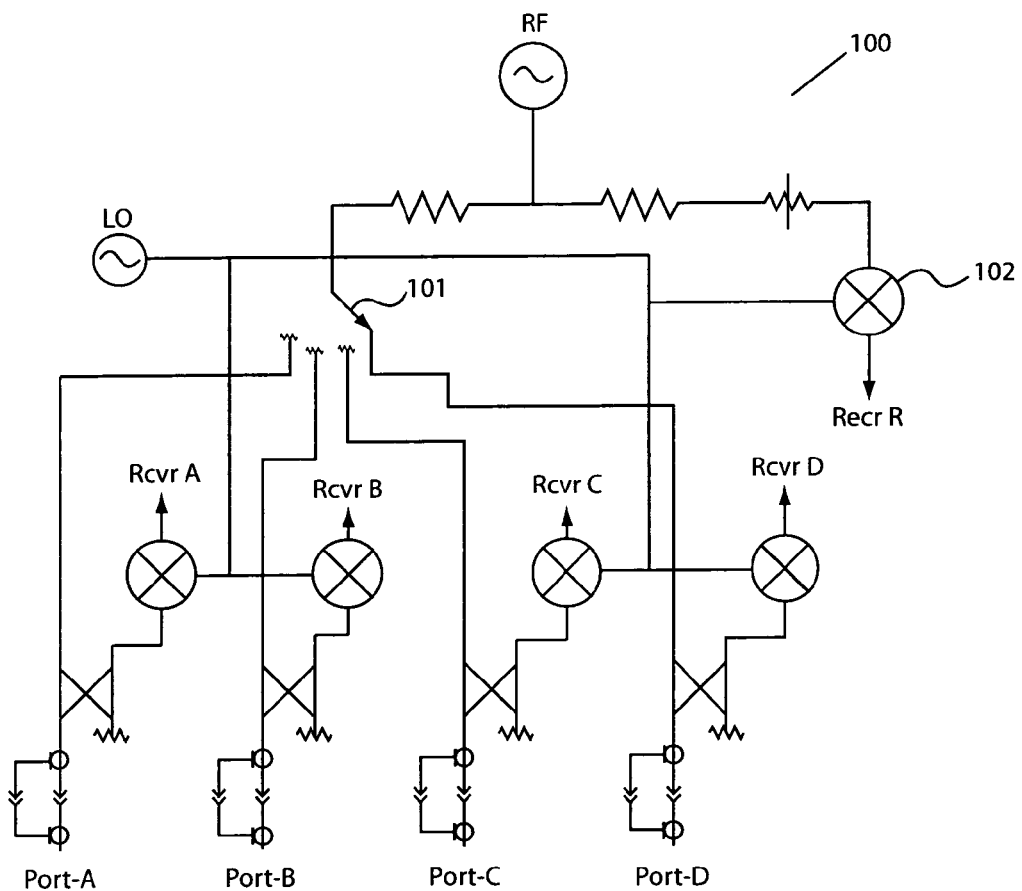
FIG. 1 depicts a conventional single reference receiver VNA.
Figure 2:
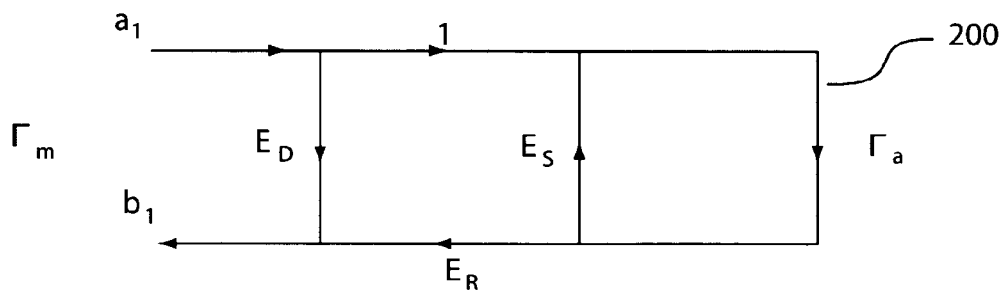
FIG. 2 depicts a one-port VNA error model.

To assist the reader's understanding of calibration of VNAs according to some representative embodiments, the following mathematical discussion is provided. In FIG. 2, one-port VNA error model 200 is shown. The error terms include directivity ($E_D$), source match ($E_S$) and reflection tracking ($E_R$). In matrix equation form, the error model is as follows:

$$\begin{bmatrix} E_D \\ E_S \\ E_S E_D - E_R \end{bmatrix} = \begin{bmatrix} 1 & \Gamma_{m1}\Gamma_{a1} & -\Gamma_{a1} \\ 1 & \Gamma_{m2}\Gamma_{a2} & -\Gamma_{a2} \\ 1 & \Gamma_{m3}\Gamma_{a3} & -\Gamma_{a3} \end{bmatrix}^{-1} \begin{bmatrix} \Gamma_{m1} \\ \Gamma_{m2} \\ \Gamma_{m3} \end{bmatrix} \quad (1)$$

Figure 3:
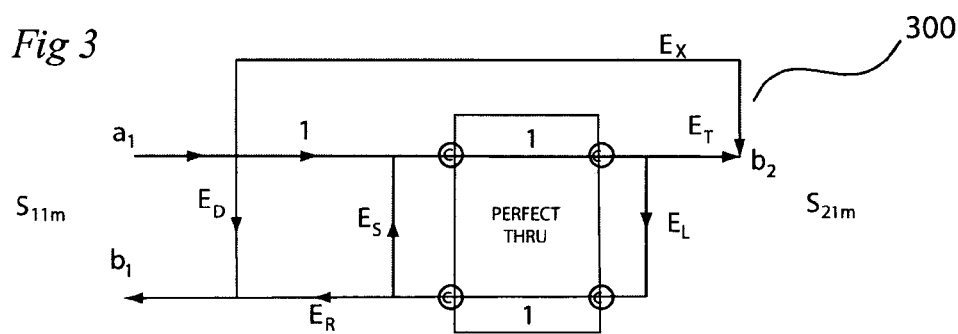
FIG. 3 depicts the "forward" half of the twelve term error model.

The twelve term error model is an extension of the one-port error model that includes four additional transmission error terms plus two cross talk terms. FIG. 3 depicts the "forward" half of twelve term the error model 300. The "reverse" half is the same except that $S_{11}$ is replaced by $S_{22}$ and $S_{21}$ is replaced by $S_{12}$. The load match ($E_L$) and transmission tracking ($E_T$) terms are determined as follows:

$$E_L = \frac{(S_{11m} - E_D)}{[E_S(S_{11m} - E_D) + E_R]} \quad (2)$$

$$E_T = S_{21m}(1 - E_S E_L) - E_x \quad (3)$$

Figure 4:
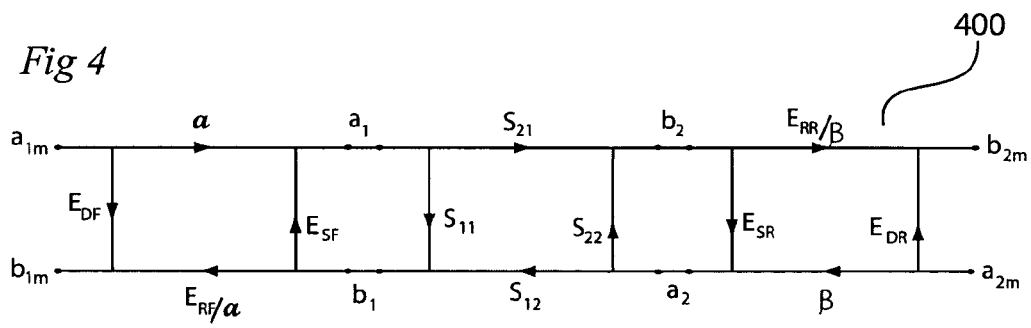
FIG. 4 depicts a signal flow graph associated with the eight term error model.
Figure 5:
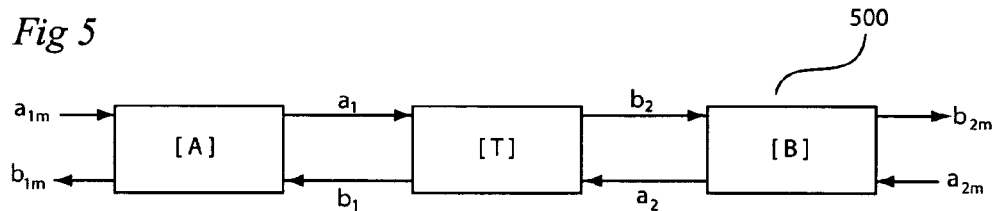
FIG. 5 depicts the matrix representation of the eight term error model.

A VNA measurement system may also be represented by the eight term error model. Signal flow graph 400 associated with the eight term error model is shown in FIG. 4. The matrix solution 500 is shown in FIG. 5. The terms "a" and "b" are used to differentiate between the applied and generated signals. The numerical subscripts refer to respective ports. The subscript "m" ($a_{1m}$, $a_{2m}$, $b_{2m}$, and $b_{1m}$) is used to indicate the measurements made by the VNA. Matrices [A], [T], and [B] are cascade matrices where matrices [A] and

[B] represent the error terms and the [T] matrix represents the S-parameters. The matrices can be represented as follows:

$$[T_{mc}] = [A] * [T] * [B] = \qquad (4)$$

$$\left(\frac{\beta}{\alpha}\right)\left(\frac{1}{E_{RR}}\right)\begin{bmatrix} \Delta_A & E_{DF} \\ -E_{SF} & 1 \end{bmatrix} * [T] * \begin{bmatrix} \Delta_B & E_{SR} \\ -E_{DR} & 1 \end{bmatrix}$$

$$T_{mc} = \frac{1}{S21_{mc}}\begin{bmatrix} -\Delta_{Sm} & S11_{mc} \\ -S22_{mc} & 1 \end{bmatrix} \text{ where}$$

$$\Delta_{Sm} = S11_{mc}S22_{mc} - S21_{mc}S12_{mc}$$

$$\Delta_A = E_{RF} - E_{DF}E_{SF} \qquad \Delta_B = E_{RR} - E_{DR}E_{SR}$$

where $[T_{mc}]$ is a matrix containing the switch error corrected measurement data. If each port has two receivers, four measurements can be taken in the forward and reverse direction and the switch error can be formulated as follows:

$$[S_m] = \begin{bmatrix} \frac{b_{1mf}}{a_{1mf}} & \frac{b_{1mr}}{a_{2mr}} \\ \frac{b_{2mf}}{a_{1mf}} & \frac{b_{2mr}}{a_{2mr}} \end{bmatrix} = \begin{bmatrix} S_{11m} & S_{12m} \\ S_{21m} & S_{22m} \end{bmatrix} \qquad (5)$$

$$[S_{mc}] = \begin{bmatrix} S_{11mc} & S_{12mc} \\ S_{21mc} & S_{22mc} \end{bmatrix}; \quad [M_{sc}] = \begin{bmatrix} 1 & \frac{a_{1mr}}{a_{2mr}} \\ \frac{a_{2mf}}{a_{1mf}} & 1 \end{bmatrix} = \begin{bmatrix} 1 & L_r \\ L_f & 1 \end{bmatrix}$$

$$[S_m] = [S_{mc}] * [M_{sc}] \text{ and } [S_{mc}] = [S_m] * [M_{sc}]^{-1}$$

By applying a one port calibration method to port 1 and a one port calibration method to port 2, six of the error terms ($E_{DF}$, $E_{RF}$, $E_{SF}$, $E_{SR}$, $E_{RR}$, and $E_{DR}$) can be determined. The $\alpha$ and $\beta$ terms remain to be determined.

By connecting a thru between port-1 and port-2 and measuring the S-parameters, four more equations are defined. After correcting the measured data for switch errors, equation (4) is defined. If $S_{21}$, and $S_{12}$ of the thru are equal, the determinant of [T] is equal to one and the determinants of equation (4) can be simplified as follows:

$$|T_{mc}| = |A| * |T| * |B| = k^2|A'| * |B'| \qquad (6)$$

$$k = \left(\frac{\beta}{\alpha}\right)\left(\frac{1}{E_{RR}}\right); \quad [A'] = \begin{bmatrix} \Delta_A & E_{DF} \\ -E_{SF} & 1 \end{bmatrix}; \quad [B'] = \begin{bmatrix} \Delta_B & E_{SR} \\ -E_{DR} & 1 \end{bmatrix}$$

$$|T_{mc}| = \frac{S_{12mc}}{S_{21mc}}; \quad |A'| = E_{RF}; \quad |B'| = E_{RR} \qquad (7)$$

$$k^2 = \frac{|T_{mc}|}{|A'|*|B'|} = \frac{S_{12mc}}{S_{21mc}E_{RF}E_{RR}}, \quad k = \pm\sqrt{\frac{S_{12mc}}{S_{21mc}E_{RF}E_{RR}}}$$

Figure 6:
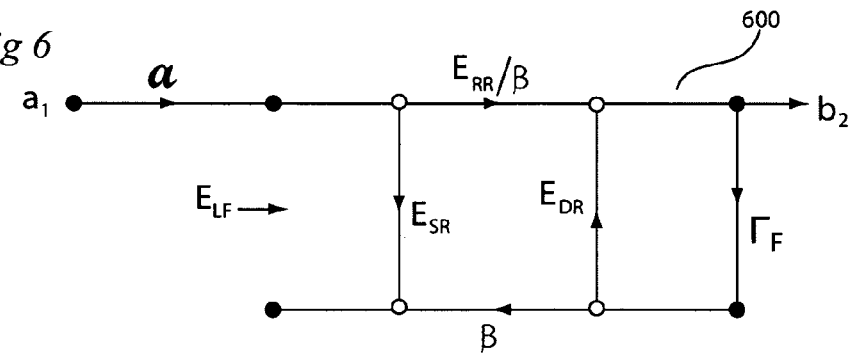
FIG. 6 depicts the load match and transmission tracking model.

In order to determined the correct root of K, some knowledge of the phase or electrical length of the thru is typically employed. After calculating the correct value of K, the value $\alpha/\beta$ can be determined as is known in the art. Additionally, load match and transmission tracking model 600 is shown in FIG. 6. The load match and transmission tracking error terms can then be calculated:

$$E_{LF} = E_{SR} + \frac{E_{RR}\Gamma_f}{1-E_{DR}\Gamma_f}, \quad E_{LR} = E_{SF} + \frac{E_{RF}\Gamma_f}{1-E_{DF}\Gamma_r} \qquad (8)$$

$$E_{TF} = \left(\frac{\alpha}{\beta}\right)\left(\frac{E_{RR}}{1-E_{DR}\Gamma_f}\right), \quad E_{TR} = \left(\frac{\beta}{\alpha}\right)\left(\frac{E_{RF}}{1-E_{DF}\Gamma_r}\right) \qquad (9)$$

As previously discussed, the switch error correction terms can be readily calculated when the VNA includes two receivers per port. However, using conventional techniques, the single reference receiver design imposes a significant complication to calibration of a VNA using the 8-term error model. Some representative embodiments overcome this difficulty by the realization that the preceding mathematical derivation can be employed in "reverse" order. Specifically, if the load match term ($E_L$) has been determined and the other 1-port error terms are known ($E_D$, $E_S$ and $E_R$) are known, the switch error terms ($\Gamma_f$ and $\Gamma_r$) can be calculated. The switch error terms are unique to each port (provided that only one switch is involved) as given by:

$$\Gamma_f = \frac{(E_{LF}-E_{SR})}{E_{RR}+E_{DR}(E_{LF}-E_{SR})}, \quad \Gamma_r = \frac{(E_{LR}-E_{SF})}{E_{RF}+E_{DF}(E_{LR}-E_{SF})} \qquad (10)$$

The switch error terms can be used to correct the switch error in the measurement data as follows:

$$[S_{mc}] = [S_m][M_{SC}]^{-1}; \quad [M_{SC}] = \begin{bmatrix} 1 & \Gamma_r \\ \Gamma_f & 1 \end{bmatrix} \qquad (11)$$

FIG. 7 depicts a flowchart for calibration of a multi-port VNA by calculating switch error correction terms using the preceding mathematical analysis of VNA error models. In step 701, respective two-port calibrations are performed for a subset of the ports. The two-port calibrations determine the load match terms and the other one port error terms. The pairs of ports for the two-port calibrations are selected such that all the systematic errors of each port are determined. In step 702, the switch error terms are calculated and one or several switch error correction matrices are generated depending upon the number of ports of the VNA.

In step 703, one or several unknown thru calibrations are applied to pairs of ports of the VNA depending upon the number of ports of the VNA. Each pair of ports selected for the unknown thru calibration(s) is different than the pairs of ports selected for the two-port calibrations. Also, the total number of pairs of ports including both two-port and unknown thru calibrations should equal N–1, where N represents the number of ports of the VNA. In step 704, the switch error correction matrix/matrices are applied to the measurement data generated by the unknown thru calibration(s). In step 705, the forward and reverse transmission tracking errors for the unknown through path(s) are determined using the corrected measurement data. After step 705, the transmission tracking error terms have been determined for N–1 ports. In step 706, the remaining [N(N–1)/2] transmission tracking error terms are determined from the calculated transmission tracking error using known methods.

Figure 8:
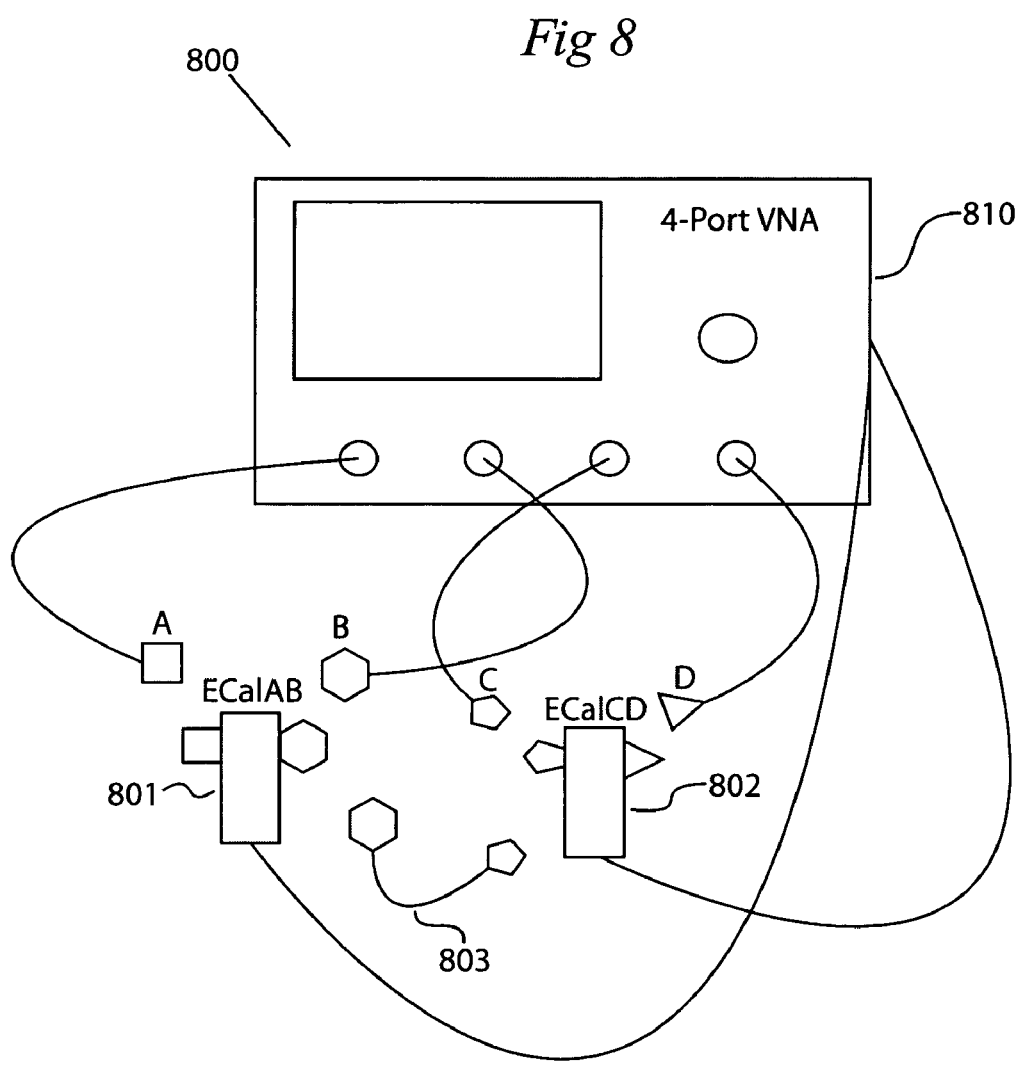
FIG. 8 depicts a set-up for calibration of a VNA according to one representative embodiment.

Reference is now made to system 800 of FIG. 8 to illustrate application of the calibration process to four port VNA 801 according to one representative embodiment.

System 800 includes ECal module 801 that is an module that electronically steps through a plurality of impedance states (such as short, open, load, and thru) to facilitate a suitable calibration method. Such modules are commercially available from Agilent Technologies, Inc. ECal module 801 is adapted to couple to the connector types associated with ports A and B. ECal module 802 is similar to ECal module 801 except ECal module 802 is adapted to couple to the connector types associated with ports C and D. Adapter BC 803 is essentially a line between connectors adapted to couple to ports B and C. In many cases, a mechanical calibration kit can be substituted for the ECAL modules.

A flowchart for calibrating VNA 701 is shown in FIG. 9. In step 901, a two-port calibration is performed on ports A and B using ECal module 801. The following error terms are calculated using the two-port calibration: $E_{DA}$, $E_{SA}$, $E_{RA}$, $E_{DB}$, $E_{SB}$, $E_{RB}$, $E_{LA}$, $E_{LB}$, $E_{TAB}$, $E_{TBA}$, $\Gamma_{AB}$, $\Gamma_{BA}$. In step 902, a two-port calibration is performed on ports C and D using ECal module 802. The following error terms are calculated using the two-port calibration: $E_{DC}$, $E_{SC}$, $E_{RC}$, $E_{DD}$, $E_{SD}$, $E_{RD}$, $E_{LC}$, $E_{LD}$, $E_{TCD}$, $E_{TDC}$, $\Gamma_{CD}$, $\Gamma_{DC}$.

In step 904, error terms $E_{TAC}$ and $E_{TCA}$ are determined from error terms $E_{TAB}$, $E_{TBA}$, $E_{TBC}$, and $E_{TCB}$. In step 905, error terms $E_{TBD}$ and $E_{TDB}$ are determined from error terms $E_{TBC}$, $E_{TCB}$, $E_{TCD}$, and $E_{TDC}$. In step 906, error terms $E_{TAD}$ and $E_{TDA}$ are determined from error terms $E_{TAB}$, $E_{TBA}$, $E_{TBD}$, and $E_{TDB}$. All transmission path errors of VNA 701 are calculated upon completion of step 905.

Figure 10:
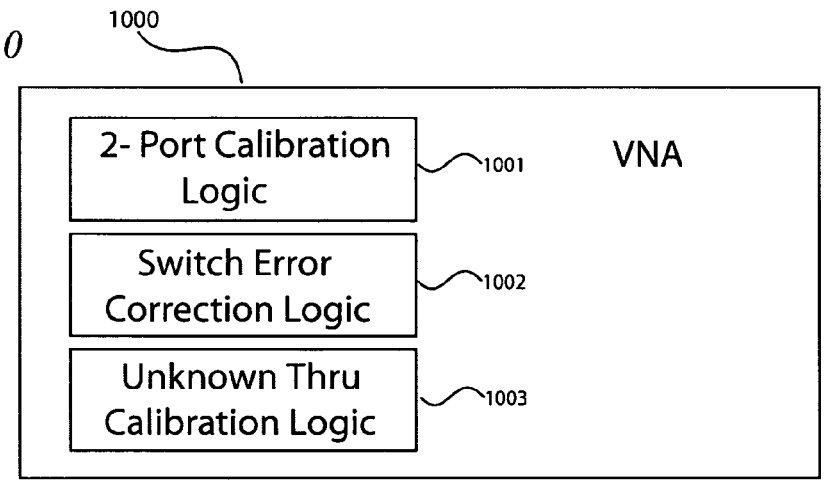
FIG. 10 depicts a VNA according to one representative embodiment.

FIG. 10 depicts VNA 1000 according to one representative embodiment. In one embodiment, VNA 1000 implements the operations shown in FIG. 7. The operations can be implemented using any suitable logic such code or software instructions and a suitable processor. Alternatively, the operations can be implemented using integrated circuitry. VNA 1000 comprises 2-port calibration logic 1001 that determines each port's systematic errors. VNA 1000 further comprises switch error correction calculation logic 1002 that generates switch error correction matrices from the systematic error terms. Unknown error correction logic 1003 calculates transmission tracking error correction terms for a subset of ports.

By appropriately selecting ports and by utilizing the load match terms to calculate a switch correction matrix, some representative embodiments enable the calibration of a VNA to occur more efficiently. A fewer number of ECal modules are used than would otherwise be required by known methodologies. Additionally, for VNAs with two reference receivers for each test port, (provided that the reference receivers measure the $a_3^f$ and $a_0^r$ terms correctly) the unknown thru calibration method can be used to perform 2-port calibrations on all the port pairs. For non mate-able ports, this method eliminates the need to perform adapter removal calibration. The omission of adapter removal calibration saves a substantial amount of time and reduces calibration error.

What is claimed is:

1. A method of calibrating a multi-port vector network analyzer (VNA), comprising:
   (i) performing two-port calibrations on pairs of ports to determine forward and reverse systematic error terms associated with each pair of ports, wherein said pairs of ports are selected such that each port's systematic error terms are determined;
   (ii) generating a switch error correction matrix using data from said two-port calibrations; and
   (iii) performing unknown thru calibration for at least one pair of ports that was not utilized in step (i), wherein said unknown thru calibration comprises applying said switch error correction matrix to measurement data and determining transmission tracking error terms using said corrected measurement data.

2. The method of claim 1 further comprising:
   calculating transmission tracking error terms for remaining pairs of ports of said VNA using transmission tracking error terms determined in steps (i) and (iii).

3. The method of claim 1 wherein said multi-port VNA comprises only one reference receiver.

4. The method of claim 1 wherein said each port of said multi-port VNA possesses a different connector type.

5. The method of claim 1 wherein said multi-port VNA comprises N ports, N is an even number, and N/2 ports are calibrated in step (i).

6. The method of claim 1 wherein said multi-port VNA comprises N ports, N is an odd number, and (N+1)/2 ports are calibrated in step (i).

7. The method of claim 1 wherein said multi-port VNA comprises N ports, N is an even number, and the unknown thru calibration is performed for a minimum of (N/2−1) ports.

8. The method of claim 1 wherein said multi-port VNA comprises N ports, N is an odd number, and the unknown thru calibration is performed for a minimum of [(N−1)/2−1] ports.

9. The method of claim 1 wherein said generating a switch error correction matrix comprises determining switch error terms using the following equations:

$$\Gamma_f = \frac{(E_{LF} - E_{SR})}{E_{RR} + E_{DR}(E_{LF} - E_{SR})}, \Gamma_r = \frac{(E_{LR} - E_{SF})}{E_{RF} + E_{DF}(E_{LR} - E_{SF})},$$

where $\Gamma_f$ and $\Gamma_r$ are the switch error terms, $E_{LF}$ and $E_{LR}$ are load error terms, $E_{SR}$ and $E_{SF}$ are source match error terms, $E_{RR}$ and $E_{RF}$ are reflection tracking error terms, and $E_{DR}$ and $E_{DF}$ are directivity error terms.

10. The method of claim 1 wherein step (i) comprises:
   operating an electronic module that steps through a plurality of impedance states.

11. The method of claim 1 further comprising:
   coupling a mechanical calibration kit to pairs of ports during step (i).

12. A vector network analyzer (VNA), comprising:
   logic for determining forward and reverse systematic error terms associated with each pair of ports using two-port calibration data, wherein said pairs of ports are selected such that each port's systematic error terms are determined;
   logic for generating a switch error correction matrix using error terms calculated by said logic for determining; and
   logic for calculating transmission tracking error terms for at least one pair of ports according to an unknown thru calibration, wherein said switch error correction matrix is applied to measurement data generated by said unknown thru calibration.

13. The VNA of claim 12 further comprising:
   logic for calculating transmission tracking error terms for remaining pairs of ports of said VNA using transmission tracking error terms from said logic for determining and said logic for calculating.

14. The VNA of claim 12 wherein said VNA comprises only one reference receiver.

15. The VNA of claim 12 wherein each port of said VNA possesses a different connection type.

16. The VNA of claim 12 wherein said VNA comprises N ports, N is an even number, and N/2 ports are calibrated by said logic for determining.

17. The VNA of claim 12 wherein said VNA comprises N ports, N is an odd number, and (N+1)/2 ports are calibrated by said logic for determining.

18. The VNA of claim 12 wherein said VNA comprises N ports, N is an even number, and the unknown thru calibration is performed for a minimum of (N/2−1) ports.

19. The VNA of claim 12 wherein said VNA comprises N ports, N is an odd number, and the unknown thru calibration is performed for a minimum of [(N−1)/2−1] ports.

20. The VNA of claim 12 wherein said logic for generating a switch error correction matrix comprises determining switch error terms using the following equations:

$$\Gamma_f = \frac{(E_{LF} - E_{SR})}{E_{RR} + E_{DR}(E_{LF} - E_{SR})}, \Gamma_r = \frac{(E_{LR} - E_{SF})}{E_{RF} + E_{DF}(E_{LR} - E_{SF})},$$

where $\Gamma_f$ and $\Gamma_r$ are the switch error terms, $E_{LF}$ and $E_{LR}$ are load error terms, $E_{SR}$ and $E_{SF}$ are source match error terms, $E_{RR}$ and $E_{RF}$ are reflection tracking error terms, and $E_{DR}$ and $E_{DF}$ are directivity error terms.

* * * * *